United States Patent
Chen

(10) Patent No.: US 7,219,504 B2
(45) Date of Patent: May 22, 2007

(54) HEAT DISSIPATION SYSTEM WITH AN AIR COMPRESSING MECHANISM

(75) Inventor: Wan-Tien Chen, Taipei (TW)

(73) Assignee: Egbon Electronics Ltd. (TW)

( * ) Notice: Subject to any disclaimer, the term of this patent is extended or adjusted under 35 U.S.C. 154(b) by 186 days.

(21) Appl. No.: 11/053,241

(22) Filed: Feb. 9, 2005

(65) Prior Publication Data

US 2006/0174636 A1  Aug. 10, 2006

(51) Int. Cl.
*F25B 9/00* (2006.01)

(52) U.S. Cl. ...................... 62/86; 62/259.2; 165/104.33

(58) Field of Classification Search .................... 62/86, 62/401, 402, 259.2; 165/104.33; 361/679, 361/690
See application file for complete search history.

(56) References Cited

U.S. PATENT DOCUMENTS

| | | | | |
|---|---|---|---|---|
| 5,373,707 A | * | 12/1994 | Ostersetzer et al. | ........... 62/401 |
| 5,544,013 A | * | 8/1996 | Chiou | ........................ 361/687 |
| 5,930,135 A | * | 7/1999 | Janko | ........................ 363/144 |
| 6,006,537 A | * | 12/1999 | Ersmambetov et al. | ....... 62/401 |
| 6,349,760 B1 | * | 2/2002 | Budelman | .................. 165/80.4 |
| 6,600,649 B1 | * | 7/2003 | Tsai et al. | .................... 361/697 |
| 6,793,009 B1 | * | 9/2004 | Sarraf | ................... 165/104.33 |
| 6,798,659 B2 | * | 9/2004 | Chen | .......................... 361/697 |
| 6,813,149 B2 | * | 11/2004 | Faneuf et al. | ............... 361/687 |
| 6,940,717 B2 | * | 9/2005 | Shih-Tsung | ................. 361/695 |
| 6,963,488 B1 | * | 11/2005 | Chen | .......................... 361/687 |
| 6,991,436 B2 | * | 1/2006 | Beckman et al. | ........... 417/201 |
| 2004/0027806 A1 | * | 2/2004 | Lin | ............................. 361/704 |

FOREIGN PATENT DOCUMENTS

JP        2002-26560 A  *  1/2002

* cited by examiner

*Primary Examiner*—Mohammad M. Ali
(74) *Attorney, Agent, or Firm*—Lowe Hauptman & Berner, LLP

(57) ABSTRACT

A heat dissipation system, including an air compressor mechanism disposed in a body shell, which has an inlet and enlarged outlet. An air is directed to the air compressor mechanism, and compressed. Upon exhaling the body shell, a compressed air will rapidly expand and a heat generated from electrical appliances installed thereunder will be reduced to a functional level. The system is applicable for the heat dissipating to computer devices, electronic appliances, or heat producing devices.

4 Claims, 6 Drawing Sheets

HEAT DISSIPATION SYSTEM WITH AN AIR COMPRESSING MECHANISM

FIELD OF THE INVENTION

The present invention relates to a heat dissipation system, and more particularly, to a heat sink by utilizing an air compressor mechanism, which cools heat-generating devices via rapid expansion of compressed air. The heat dissipation system is applicable for removing heat from computer devices, electronic appliances, or other heat-generating devices.

BACKGROUND OF THE INVENTION

Computer systems today advance by leaps and bounds. To account for such progress, CPUs therein inevitably work at ever-faster frequencies and hence generate ever-higher temperatures. Thus, it is imperative to rely on highly effective heat dissipation devices to maintain the CPUs temperatures at a functional level.

A conventional heat dissipation apparatus "A" is disclosed in FIG. 6. It mainly consists of a fan "c" and a heat dissipation device "b" which is positioned on the top of a central processing unit "d", consisted of a plurality of fins "b1" and a base stand b2. The fan "c" is located on top of these fins "b1". It is generally accepted that, in use, electronic devices of CPUs "d" will generate a heat. The heat would be conducted through the base stand "b2" of the heat dissipation device "b" to the plurality of fins "b1" and thus undergo a cool down process via air currents "a" generated by the fan "c".

Presently, a fan mechanism, as described above, is the generally adopted means of heat dissipation. The fan mechanism, being the main source of heat dissipation, uses its fans to exert pressure on an air drawn from one end so that the air could be blown out through the other end, thus creating an airflow to dissipate the heat from electronic devices. However, due to its restricted structure, the fan falls short in generating significant enough pressure difference between its air intake and outtake to achieve the air compression and, subsequently, air expansion. Hence, for the conventional fan, it is impossible to utilize the air compression and expansion to speed up the airflow and hence to achieve better heat-dispensing effects. Furthermore, since the temperature of the air being drawn in and blown out of the fan remains constant, the airflow thus generated by the mere spinning of the fan to dissipate the heat has rather limited effects. Therefore, with electronic devices operating at ever-higher frequencies and temperatures, the conventional heat dissipation apparatus by using fans can no longer meet practical requirements.

In view of the above, the present invention intends to provide a highly effective heat dissipation system aimed at efficiently removing an ever-increasing heat generated by CPUs, or other heat-generating devices. In a nutshell, the acceleration of airflow to reduce the temperature of output air remains the focal point of the present invention.

To study further, referring to the first law of thermodynamics, which claims that "if no heat is transferred into or removed from the system, but rather having a work done on it, will lead to an increase in internal energy and result in a rise in temperature within the system; while if the work is done by the system, (i.e. a gas expands outwards), the internal energy of the system will diminish, resulting in a decrease in temperature." Using the above principle, the inventor construed that if an air is drawn into an apparatus and pressurized to yield high-compressed air, then when the latter is exhaled from the apparatus, the air will rapidly expand, resulting in an increased airflow and a decreased temperature to thus achieve the high efficiency of heat dissipation.

SUMMARY OF THE INVENTION

According to an objective of the present invention, it is to provide a heat dissipation system suitable for removing heat from computers and electronic appliances, by utilizing an air compressor mechanism to yield a pressurized air. Upon discharging, a compressed air rapidly expands to produce an increased airflow and a decreased temperature to achieve the high efficiency of heat dissipation.

According to another objective of the present invention, it is to provide a heat dissipation system suitable for directly removing a heat from computers and electronic appliances through the connection of a pipe of suitable length, capable of directing the airflow towards heated electronic appliances to help decreasing the temperature. Such an addition provides further flexibility to apply the invention. To achieve the objectives mentioned above, the heat dissipation system according to the present invention includes a body shell, with an inlet and an outlet, and an air compressor mechanism disposed within the body shell. One end of the air compressor mechanism is attached to the inlet and the other end is attached to the outlet. An air entering the body shell via the inlet will be pressurized by the air compressor mechanism and then blown out through the outlet. Upon exhaling the body shell, a compressed air will rapidly expand and generate air currents to reduce a heat generated from electronic appliances to a functional level.

The following detailed description of the disclosure will be more apparent with reference to the accompanying drawings, which show, for purposes of illustration only, a preferred embodiment in accordance with the present invention.

DETAILED DESCRIPTION OF THE PREFERRED EMBODIMENT

Figure 1:
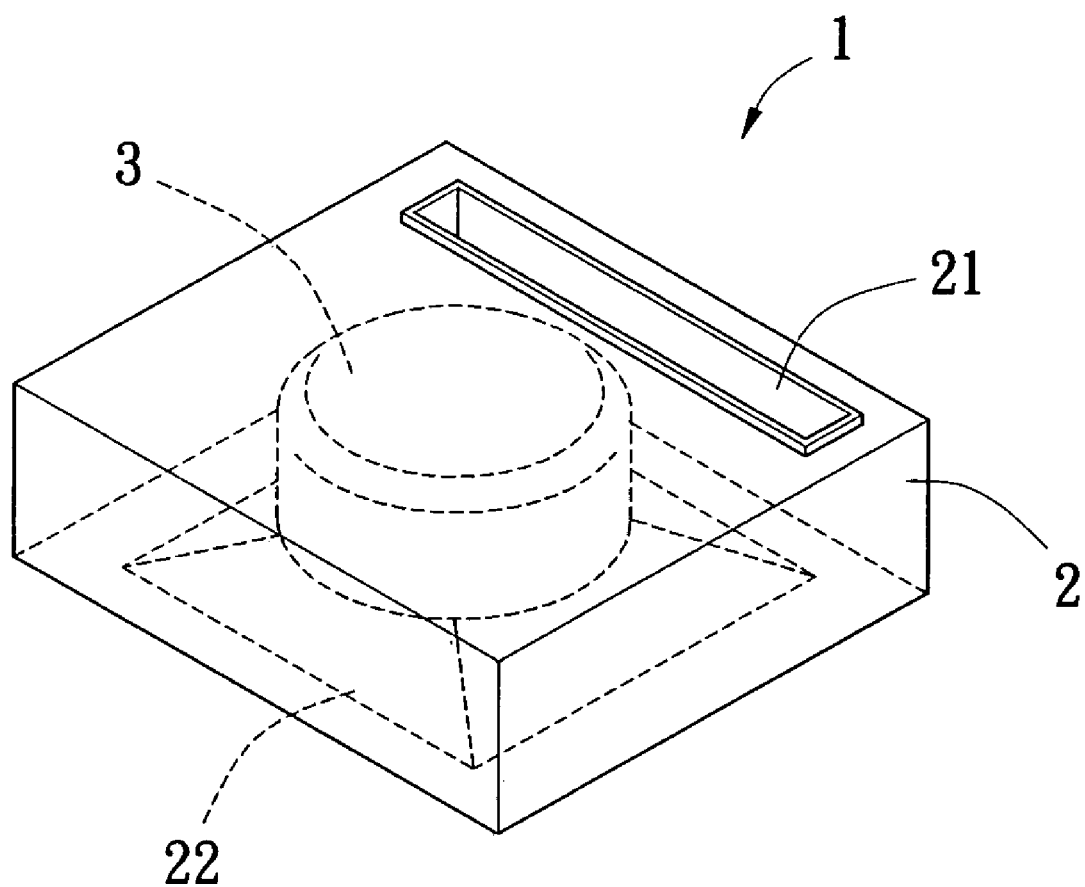
FIG. 1 is a perspective view of a first embodiment of a heat dissipation system of the present invention.
Figure 2:
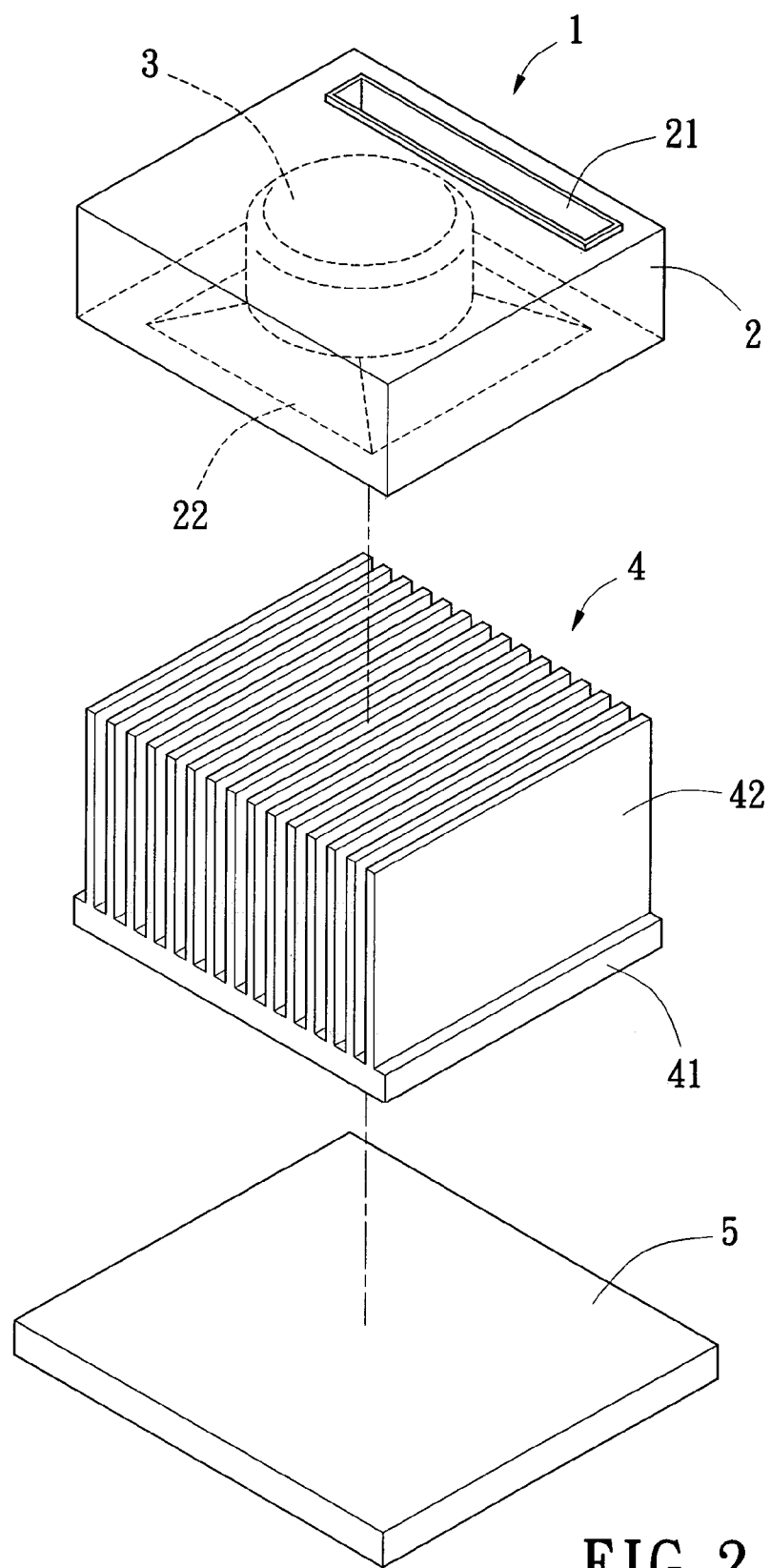
FIG. 2 is an exploded view of the heat dissipation system in FIG. 1, including a heat dissipation device and a heat-generating body.

As shown in FIGS. 1 and 2, a first embodiment of the present invention of a heat dissipation system 1 comprises a body shell 2 and an air compressor mechanism 3 therein. A heat dissipation device 4 is installed below the body shell 2, which is composed of a base stand 41 and a plurality of fins 42. The base stand 41 of the heat dissipation device 4 could be installed directly on top of a heat-generating body 5 of electronic appliances.

The body shell 2 has an inlet 21 located at its top, and an enlarged outlet 22 located underneath. The air compressor mechanism 3 is located within the body shell 2 of which one end attached to the inlet 21 and the other end directed to the outlet 22. Its functional ideology is underlined below:

According to the first law of Thermodynamics:

Q=ΔU+W, where Q is a heat added to a system, ΔU is a change in internal energy, and W is a work done by a system.

Q is positive if the heat is added to the system; Q is negative if the system is transferring the heat away. W is positive if the work is done by the system; W is negative if the work is done on the system.

In an adiabatic process, if we let the variable Q in the first law of Thermodynamics equals to zero, then the change in internal energy is equal to work done by the system, that is, the work done by the system equals the difference of internal energy decrease. When the work is done on the system (a gas is being compressed), its internal energy will increase along with its temperature. When the work is done by the system (a gas is expanding), its internal energy will decrease along with its temperature.

Figure 3:
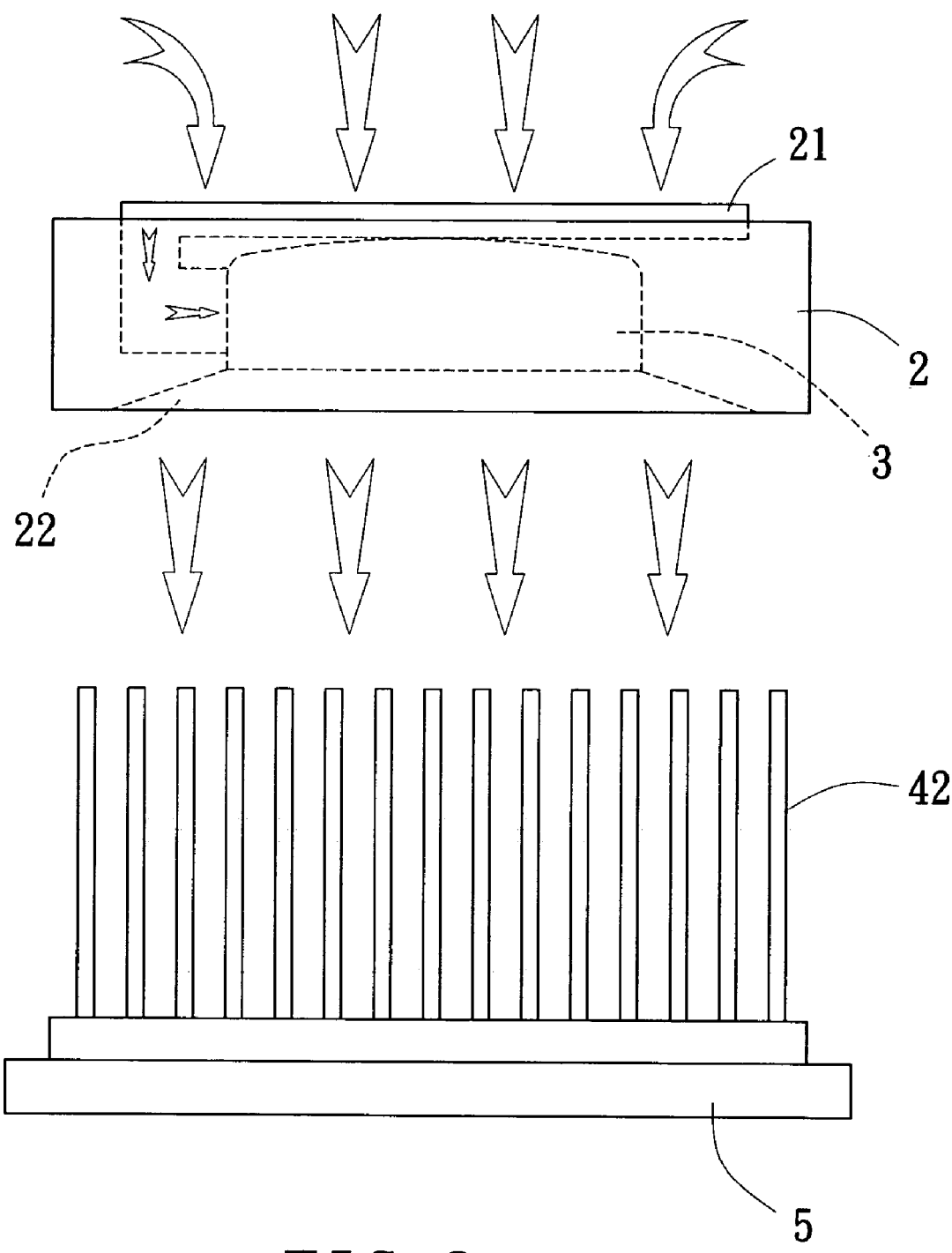
FIG. 3 is a schematic view of the heat dissipation system of FIG. 1 in use.

As shown in FIG. 3, in the present invention, when an air enters the air compressor mechanism 3 via the inlet valve 21 of the body shell 2, a pressurized air is produced. When the compressed air exhales the outlet 22 of the body shell 2, this air rapidly expands and produces a potent airflow passing through the plurality of fins 42 and thus maintains the heat-generating body 5 in a functional temperature.

Since the air compression exhales only in an adiabatic process, the pressurized air within the air compressor 3 will lead to an increase in temperature. The temperature of an exhaled air could be calculated as follows:

$$T2=T1(P2/P1)^{k-1/k}$$

T2: an output air temperature of adiabatic process,
T1: an input air temperature
P2: an output air pressure
P1: an input air pressure
k: a value of the ration of specific heats (atmospheric air equals 1.4)

In the present invention, if the air at 30° C. room temperature is pressurized to 1.5 atmosphere pressure, then upon computing form the equation, the temperature within the air compressor 3 will be 67.2° C. Although the temperature of the system rises, when the gas expands and the work is done by the system, the system temperature may decrease, and achieve the heat dissipation via high-speed exhalation. The above-mentioned operation could be applied to any general air compressors. However, if a micro air compressor is utilized, then the temperature rising problem of the pressurized air may be improved.

Figure 4:
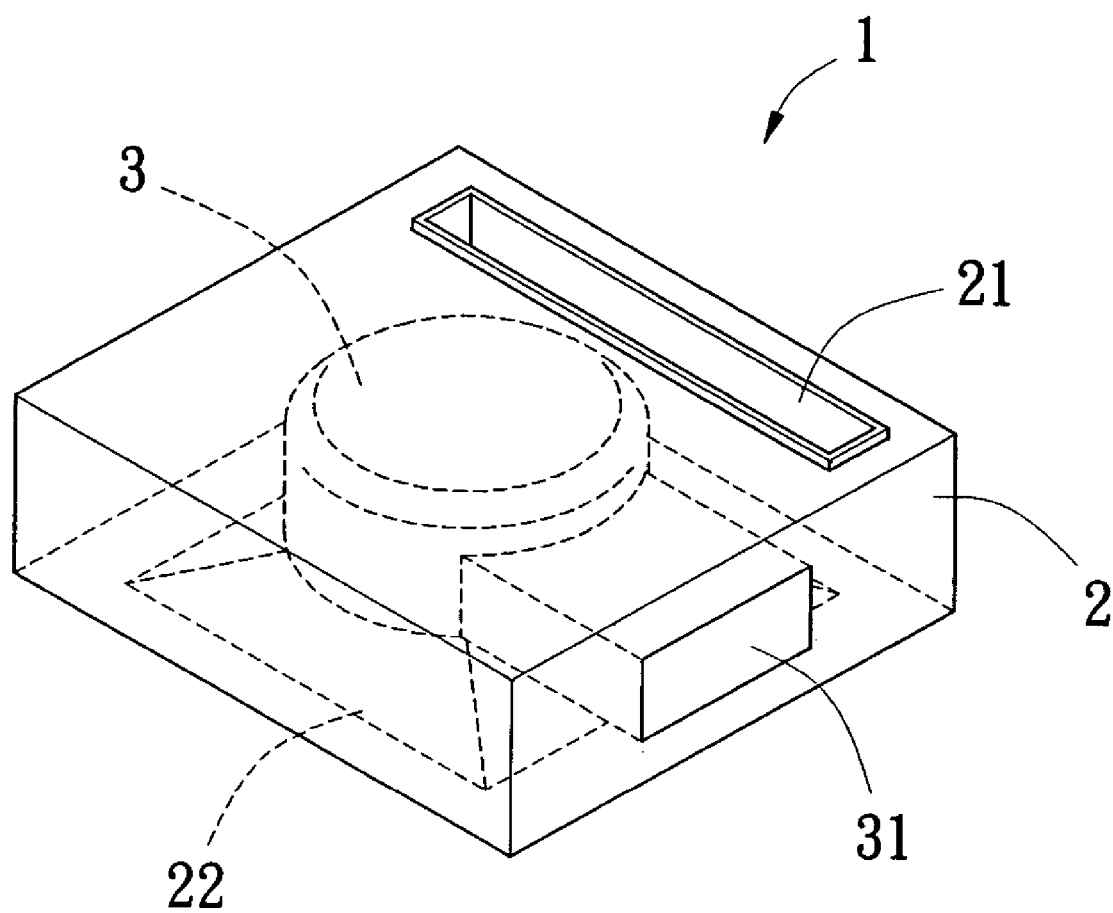
FIG. 4 is a perspective view of a second embodiment of a heat dissipation system of the present invention.

As shown in FIG. 4, the air compressor mechanism 3 is connected with a heat exchanger 31 which can be a micro heat exchanger using fluid as a cooling medium. This could result in a temperature decrease in the air compressor mechanism 3. Furthermore, when the air temperature within the air compressor mechanism 3 decreases to room temperature, the temperature of the exhaling air will be even lower. This could be coupled with the air expansion to achieve further temperature decrease.

Figure 5:
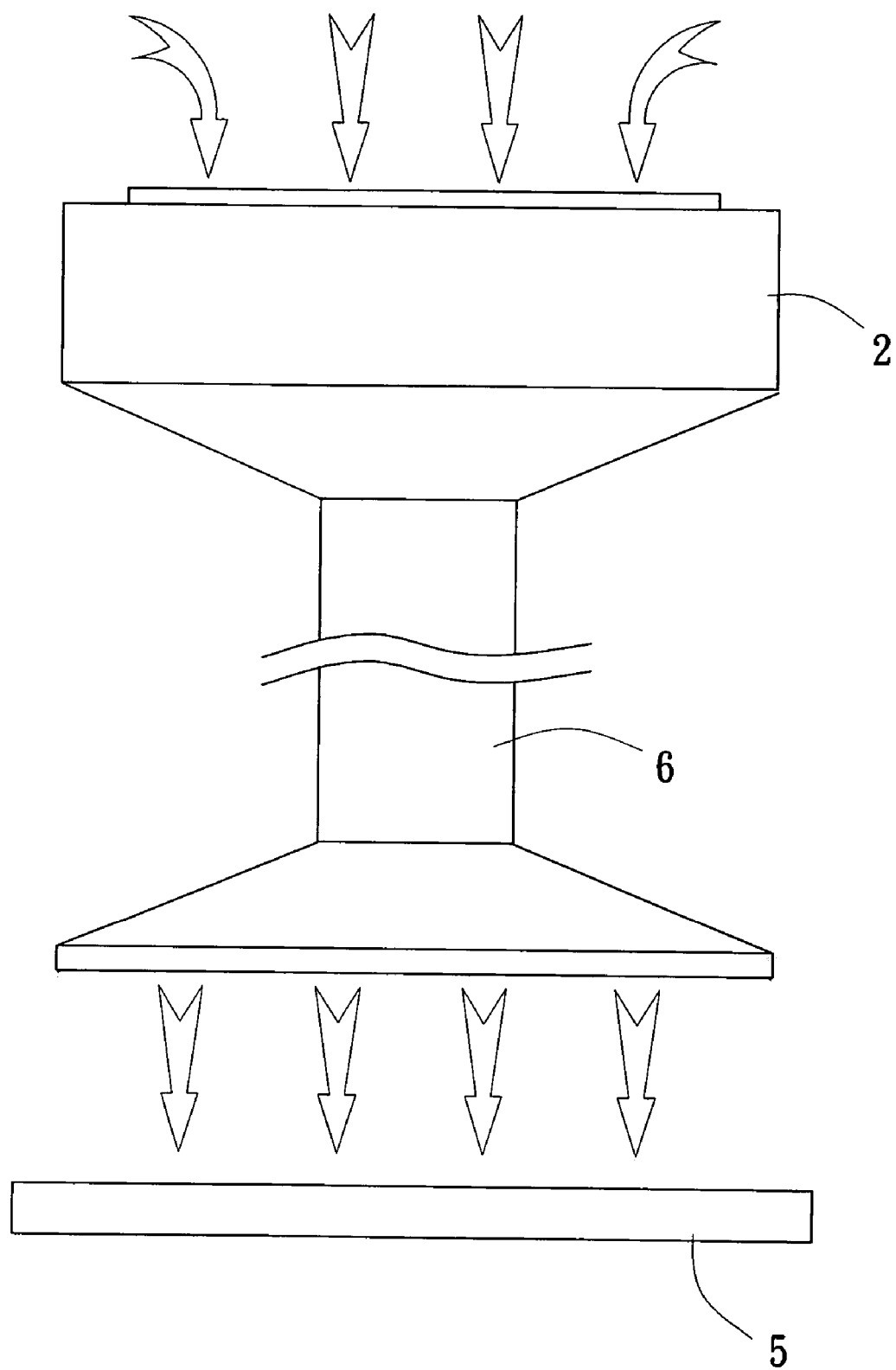
FIG. 5 is a schematic view of the present invention in use, which features a pipe connected to the heat dissipation system.
Figure 6:
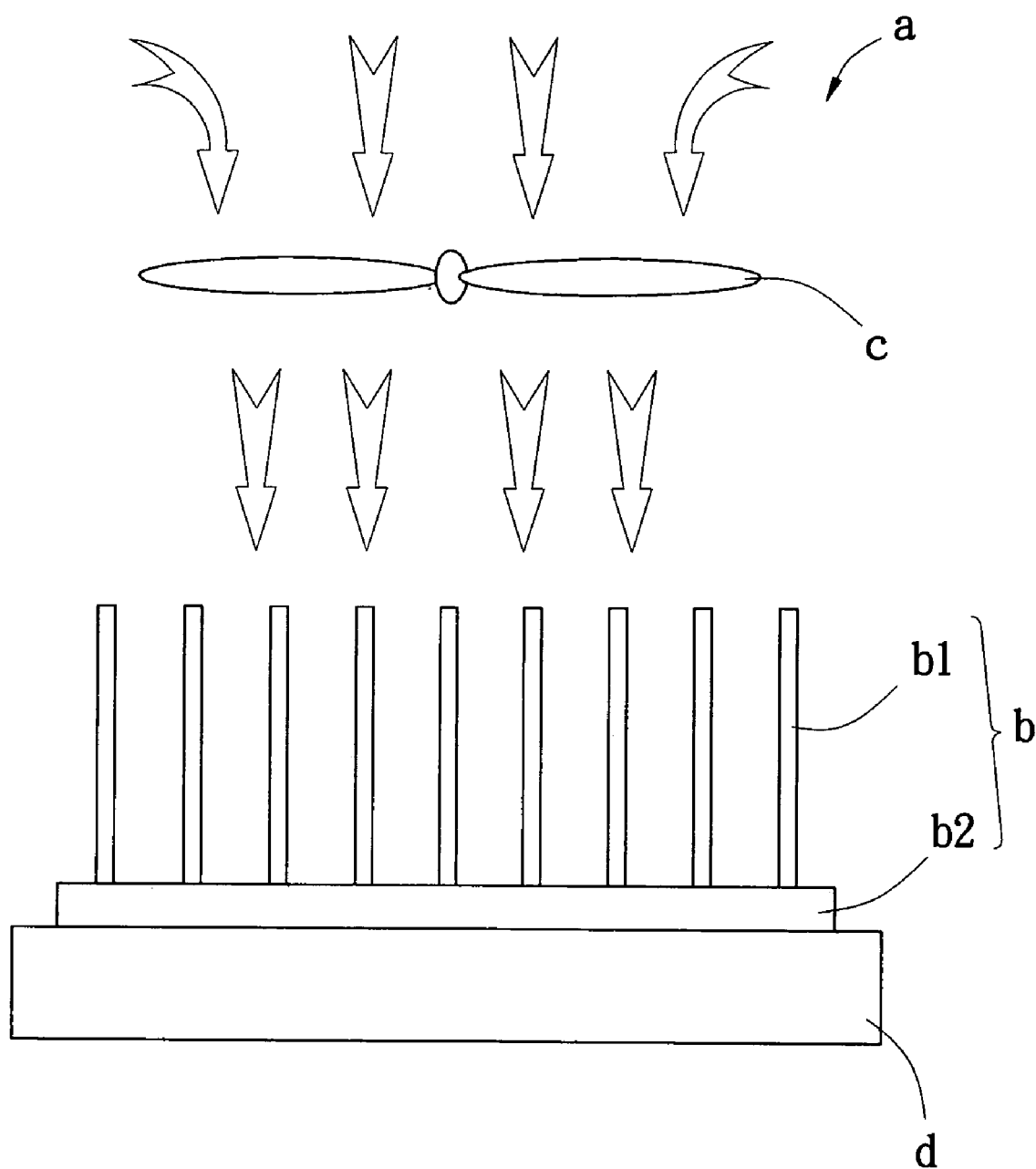
FIG. 6 is a schematic view of a conventional heat dissipation apparatus.

As shown in FIG. 5, the heat dissipation system 1, under practical use, could have the outlet 22 of the body shell 2 connected with one end of a pipe 6, with its other end acting as an extension of exhaust outlet for expanding the air to directly dissipate the heat from the heat-generating body 5.

Hence, the advantages of the present invention could be enumerated below:

1. The air compressor mechanism in the present invention could compress the air and while exhaling the latter, allow the compressed air to quickly expand to efficiently achieve heat-dissipating effects.
2. The present invention could include a heat exchanger. As a result the air temperature in the air compressor mechanism can be decreased to room temperature, and by exhaling the air of room temperature or lower temperature, a better cooling effect could be achieved.
3. In use, the body shell of the heat dissipation system could be connected with the plurality of fins of the heat dissipation devices. Taking advantage of the process of air expansion, the heat on the plurality of fins conducted from heat-generating body could be removed. Furthermore, a single pipe connection could also be utilized to connect with the heat dissipation system to direct the air to the heat-generating bodies, providing the flexibility in practical use.

While we have shown and described the embodiments in accordance with the present invention, it should be clear to those skilled in the art that further embodiments may be made without departing from the spirit of the present invention.

What is claimed is:

1. A heat dissipation system for removing heat from computers and electronic appliances, said system comprising
    a shell body having a top and a bottom and an air inlet located on said top and an enlarged outlet located on said bottom; and
    a micro air compressor mechanism having first and second ends, disposed within said shell body with one end attached to said air inlet and said second end directed to said outlet, so that air enters via said inlet and is pressurized by said micro air compressor mechanism; and is exhausted by said micro air compressor mechanism via the outlet to expand rapidly with an increasing air flow and decreasing temperature to thereby dissipate heat from a heat- generating body positioned thereunder.

2. A heat dissipation system for removing heat from computers and electronic appliances, said system comprising.
    a shell body having a top and a bottom and an air inlet located on said top and an enlarged outlet located on said bottom;
    a micro air compressor mechanism having first and second ends, disposed within said shell body with one end attached to said air inlet and said second end directed to said outlet, so that air enters via said inlet and is pressurized by said micro air compressor mechanism; and is exhausted by said micro air compressor mechanism via the outlet to expand rapidly with an increasing air flow and decreasing temperature to thereby dissipate heat from a heat-generating body positioned thereunder; and
    wherein a pipe has one end connected to the outlet of the shell body and the other end opened for directly exhaling the rapidly expanded air to the heat-generating body.

3. The heat dissipation system as claimed in claim 2, further comprising a heat exchanger to cool the air in the air compressor mechanism.

4. The heat dissipation system as claimed in claim 2, further including a heat dissipation device, which comprises a plurality of fins installed between the shell body and the heat-generating body.

* * * * *